(12) United States Patent
Pizzimenti et al.

(10) Patent No.: US 11,221,240 B2
(45) Date of Patent: Jan. 11, 2022

(54) SENSOR HOUSING DRAINAGE

(71) Applicant: Ford Global Technologies, LLC, Dearborn, MI (US)

(72) Inventors: James Pizzimenti, Carleton, MI (US); Rashaun Phinisee, Ypsilanti, MI (US); Venkatesh Krishnan, Canton, MI (US); Manan Sevak, Southfield, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 319 days.

(21) Appl. No.: 15/966,412

(22) Filed: Apr. 30, 2018

(65) Prior Publication Data

US 2019/0331509 A1 Oct. 31, 2019

(51) Int. Cl.
*G01D 11/24* (2006.01)
*B60R 11/04* (2006.01)
*B60R 11/00* (2006.01)
*H05K 5/02* (2006.01)
*H04N 5/225* (2006.01)
*G01S 7/481* (2006.01)

(52) U.S. Cl.
CPC ............ *G01D 11/245* (2013.01); *B60R 11/00* (2013.01); *B60R 11/04* (2013.01); *H04N 5/2252* (2013.01); *H05K 5/0213* (2013.01); *B60R 2011/004* (2013.01); *G01S 7/4813* (2013.01)

(58) Field of Classification Search
CPC ....... G01D 11/245; B60R 11/00; B60R 11/04; B60R 2011/004; H04N 5/2252; H05K 5/0213; G01S 7/4813; H05B 1/0236; H05B 3/20; H05B 3/34
USPC ........ 219/202, 205, 494, 219; 210/774, 163; 700/276; 165/202, 203, 222, 42, 43, 111; 429/414; 340/435
See application file for complete search history.

(56) References Cited

U.S. PATENT DOCUMENTS

| | | | | |
|---|---|---|---|---|
| 4,134,275 A | * | 1/1979 | Erickson | B60H 1/00371 62/243 |
| 4,243,176 A | * | 1/1981 | Hays | F23D 14/60 237/7 |
| 6,164,564 A | | 12/2000 | Franco et al. | |
| 6,213,198 B1 | * | 4/2001 | Shikata | B60H 1/00478 165/202 |

(Continued)

FOREIGN PATENT DOCUMENTS

KR 101345192 B1 12/2013

OTHER PUBLICATIONS

Martin Punke, Stefan Menzel, Boris Werthessen, Nicolaj Stache and Maximilian Hopfl, "Handbook for driver assistance systems" (2015) Springer International Publishing, p. 1 and 2 (Year: 2015).*

*Primary Examiner* — Tu B Hoang
*Assistant Examiner* — Yeong Juen Thong
(74) *Attorney, Agent, or Firm* — Frank A. MacKenzie; Bejin Bieneman PLC

(57) ABSTRACT

A sensor assembly includes a housing, an air inlet tube through the housing and including a drain, and a sensor in the path of air flowing through the air inlet tube. The sensor assembly may further include a heater thermally connected to the drain. A controller may be communicatively coupled to the heater and programmed to activate the heater upon detecting an ambient temperature below a temperature threshold.

14 Claims, 7 Drawing Sheets

(56) References Cited

U.S. PATENT DOCUMENTS

| | | | | |
|---|---|---|---|---|
| 6,442,956 B1* | 9/2002 | Herren | ................. | F24F 13/222 |
| | | | | 62/150 |
| 6,666,966 B1* | 12/2003 | Schluttig | ................ | E03C 1/126 |
| | | | | 210/163 |
| 6,684,878 B2* | 2/2004 | Ho | ..................... | F24D 19/0095 |
| | | | | 126/110 R |
| 6,719,215 B2 | 4/2004 | Drouillard | | |
| 7,274,973 B2* | 9/2007 | Nichols | ................. | G05B 15/02 |
| | | | | 700/276 |
| 8,675,449 B2 | 3/2014 | Mielenz | | |
| 9,885,526 B2 | 2/2018 | Maranville et al. | | |
| 2005/0047768 A1 | 3/2005 | Kuebler et al. | | |
| 2005/0103728 A1* | 5/2005 | Abdelqader | ......... | B01D 29/018 |
| | | | | 210/774 |
| 2006/0076432 A1 | 4/2006 | Haueis et al. | | |
| 2007/0215398 A1* | 9/2007 | Ferdows | ................ | B60K 11/04 |
| | | | | 180/68.4 |
| 2015/0360692 A1* | 12/2015 | Ferguson | ........... | G06K 9/00791 |
| | | | | 701/23 |

* cited by examiner

SENSOR HOUSING DRAINAGE

BACKGROUND

Vehicles, such as autonomous or semi-autonomous vehicles, typically include a variety of sensors. Some sensors detect internal states of the vehicle, for example, wheel speed, wheel orientation, and engine and transmission variables. Some sensors detect the position or orientation of the vehicle, for example, global positioning system (GPS) sensors; accelerometers such as piezo-electric or microelectromechanical systems (MEMS); gyroscopes such as rate, ring laser, or fiber-optic gyroscopes; inertial measurements units (IMU); and magnetometers. Some sensors detect the external world, for example, radar sensors, scanning laser range finders, light detection and ranging (LIDAR) devices, and image processing sensors such as cameras. A LIDAR device detects distances to objects by emitting laser pulses and measuring the time of flight for the pulse to travel to the object and back. Some sensors are communications devices, for example, vehicle-to-infrastructure (V2I) or vehicle-to-vehicle (V2V) devices. Sensor operation can be affected by temperature, e.g., a sensor that is too hot may not operate properly, as well as by moisture, e.g., a sensor in an environment that is too wet or humid may not operate properly.

DETAILED DESCRIPTION

Figure 1:
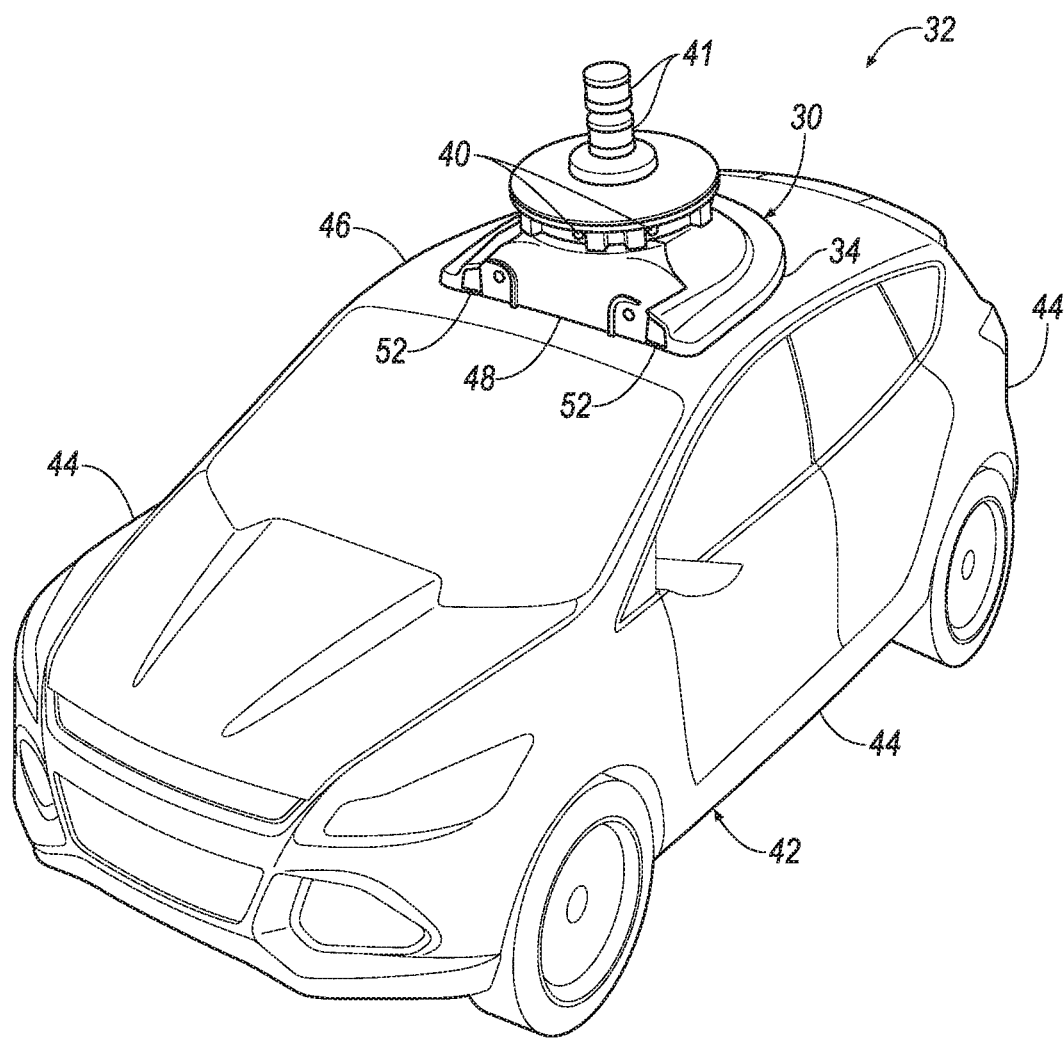
FIG. 1 is a perspective view of an example vehicle including a sensor assembly.

A sensor assembly includes a housing, an air inlet tube through the housing and including a drain, and a sensor in the path of air flowing through the air inlet tube.

The sensor assembly may further include a heater thermally connected to the drain. The drain may include a drain tube extending downward from the air inlet tube, and the heater may extend around the drain tube.

The sensor assembly may further include a controller communicatively coupled to the heater and programmed to activate the heater upon detecting an ambient temperature below a temperature threshold.

The sensor assembly may further include a controller communicatively coupled to the heater and programmed to activate the heater upon detecting a water level in the drain above a water-level threshold. The water-level threshold may be greater than half of a capacity of the drain.

The drain may include a drain valve. The sensor assembly may further include a valve actuator actuatable to open and close the drain valve. The sensor assembly may further include a controller communicatively coupled to the valve actuator and programmed to actuate the valve actuator to open the drain valve upon detecting a water level in the drain above a water-level threshold. The sensor assembly may further include a water-level sensor, and the drain may include a drain tube extending downward from the air inlet tube, and the water-level sensor may be positioned in the drain tube at a height defining the water-level threshold.

The sensor assembly may further include a water-level sensor disposed in the drain.

The air inlet tube may include an inlet opening to outside the housing and a first portion extending upward from a locally low portion including the drain to the inlet opening. The housing may include a forward-facing panel, and the forward-facing panel may include the inlet opening.

The air inlet tube may include a second portion extending upward from the locally low portion. The sensor may be downstream from the second portion along the path of air flowing through the air inlet tube.

The sensor assembly may further include a blower in the path of air flowing through the air inlet tube, and the blower may be downstream from the drain and upstream from the sensor.

The housing may be shaped to be attachable to a roof of a vehicle.

The sensor assembly may further include a plurality of sensors including the sensor, and the sensors may be positioned in the path of air flowing through the air inlet tube. The sensors may be cameras.

With reference to the Figures, a sensor assembly 30 for a vehicle 32 includes a housing 34, an air inlet tube 36 through the housing 34 and including a drain 38, and at least one interior sensor 40 in the path of air flowing through the air inlet tube 36.

The sensor assembly 30 can provide airflow to the interior sensors 40, which can cool the interior sensors 40 and help ensure continued operability of the interior sensors 40. The sensor assembly 30 can also prevent rain in the air outside the housing 34 from reaching the interior sensors 40 by catching the rain in the air inlet tube 36 and draining the resulting water via the drain 38. As described further below, the sensor assembly 30 can also drain collected water without the water freezing in cold weather.

With reference to FIG. 1, the vehicle 32 may be an autonomous vehicle. The computer can be programmed to operate the vehicle 32 independently of the intervention of a human driver, completely or to a lesser degree. The computer may be programmed to operate the propulsion, brake system, steering, and/or other vehicle systems. For the purposes of this disclosure, autonomous operation means the computer controls the propulsion, brake system, and steering without input from a human driver; semi-autonomous operation means the computer controls one or two of the propulsion, brake system, and steering and a human driver controls the remainder; and nonautonomous operation means a human driver controls the propulsion, brake system, and steering.

The vehicle 32 includes a body 42. The vehicle 32 may be of a unibody construction, in which a frame and a body 42 of the vehicle 32 are a single component. The vehicle 32 may, alternatively, be of a body-on-frame construction, in which the frame supports a body 42 that is a separate component from the frame. The frame and body 42 may be formed of any suitable material, for example, steel, aluminum, etc.

The body 42 includes body panels 44, 46 partially defining an exterior of the vehicle 32. The body panels 44, 46 may present a class-A surface, e.g., a finished surface exposed to view by a customer and free of unaesthetic blemishes and defects. The body panels 44, 46 include, e.g., a roof 46, etc.

Figure 2:
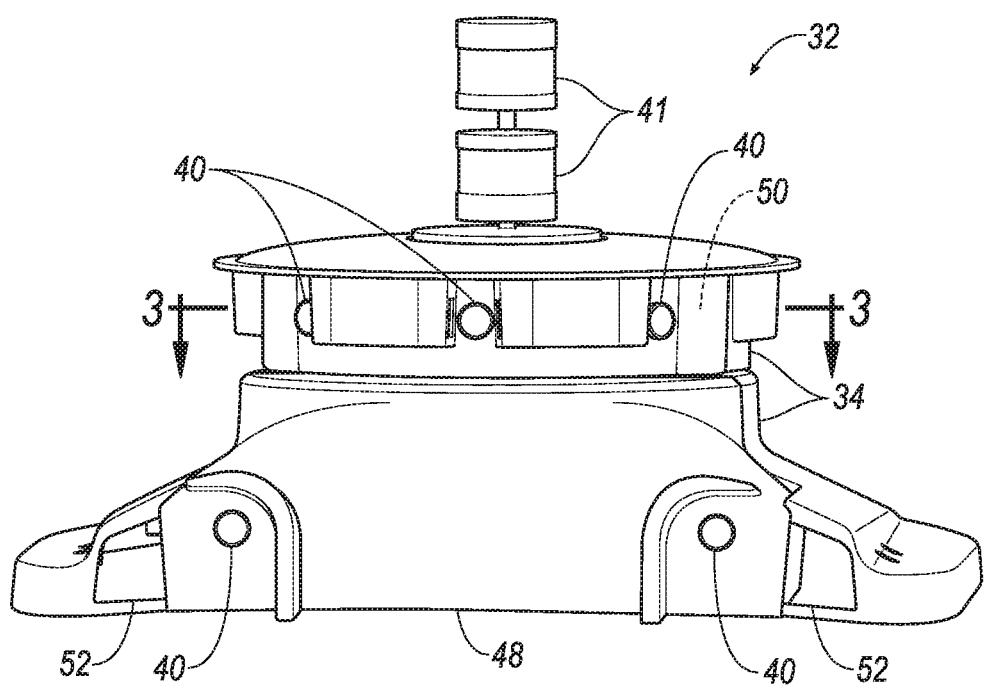
FIG. 2 is a front view of the sensor assembly.

With reference to FIG. 2, the housing 34 for the interior sensors 40 is attachable to the vehicle 32, e.g., to one of the body panels 44, 46 of the vehicle 32, e.g., the roof 46. For example, the housing 34 may be shaped to be attachable to the roof 46, e.g., may have a shape matching a contour of the roof 46. The housing 34 may be attached to the roof 46, which can provide the interior sensors 40 with an unobstructed field of view of an area around the vehicle 32. The housing 34 may include a forward-facing panel 48, i.e., a panel facing forward relative to the vehicle 32 when the housing 34 is attached to, e.g., the roof 46, as well as a top panel 84 and other side panels 86. The housing 34 may be formed of, e.g., plastic or metal.

Figure 3:
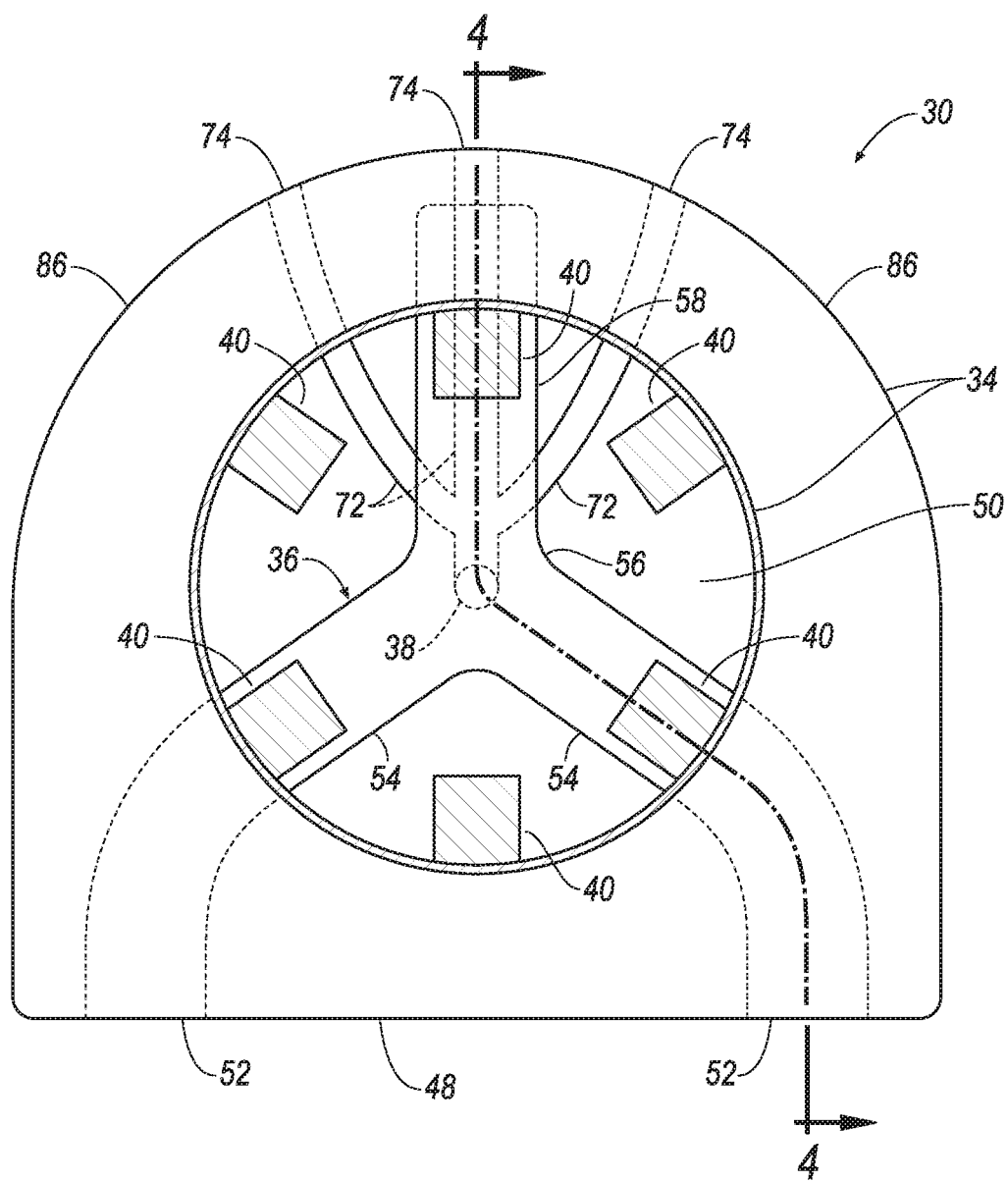
FIG. 3 is a cross-sectional top view of the sensor assembly through line 3-3 in FIG. 2.
Figure 4:
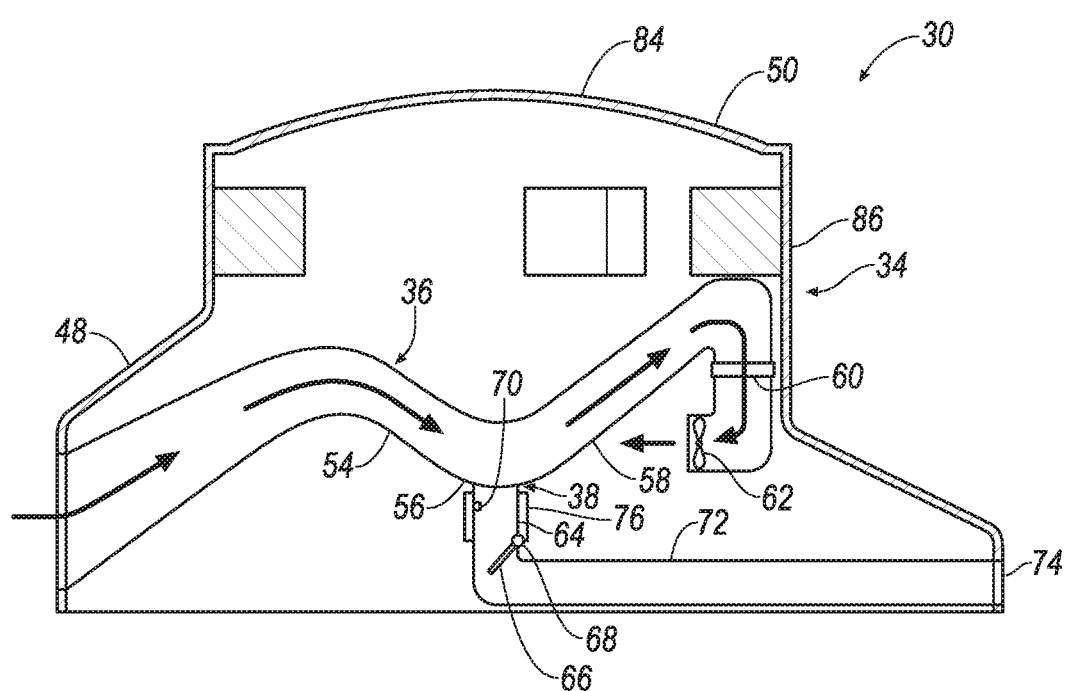
FIG. 4 is a cross-sectional side view of the sensor assembly through line 4-4 in FIG. 3.

With reference to FIGS. 3 and 4, the housing 34 may enclose and define a cavity 50; for example, the top panel 84 and side panels 48, 86 may enclose and define the cavity 50. One or more of the body panels 44, 46, e.g., the roof 46, may partially define the cavity 50, or the housing 34 may define a bottom of the cavity 50 (not shown) as well as a top panel 84 enclosing the cavity 50. The housing 34 may shield contents of the cavity 50 from external elements such as wind, rain, debris, etc.

The sensor assembly 30 includes the sensors 40, 41. The sensors 40, 41 may include the interior sensors 40 that are housed in the housing 34 and exterior sensors 41 that are exposed outside the housing 34. The cavity 50 contains the interior sensors 40 disposed in the housing 34. The interior sensors 40 may be attached directly to the roof 46 in the cavity 50, or the interior sensors 40 may be attached to the housing 34 in the cavity 50, which in turn is directly attached to the roof 46.

The sensors 40, 41 may detect the location and/or orientation of the vehicle 32. For example, the sensors 40, 41 may include global positioning system (GPS) sensors; accelerometers such as piezo-electric or microelectromechanical systems (MEMS); gyroscopes such as rate, ring laser, or fiber-optic gyroscopes; inertial measurements units (IMU); and magnetometers. The sensors 40, 41 may detect the external world, e.g., objects and/or characteristics of surroundings of the vehicle 32, such as other vehicles, road lane markings, traffic lights and/or signs, pedestrians, etc. For example, the sensors 40, 41 may include radar sensors, scanning laser range finders, light detection and ranging (LIDAR) devices, and image processing sensors such as cameras. The sensors 40, 41 may include communications devices, for example, vehicle-to-infrastructure (V2I) or vehicle-to-vehicle (V2V) devices. In particular, the interior sensors 40 disposed in the housing 34 may be cameras arranged to collectively cover a 360° horizontal field of view, and the exterior sensors 41 disposed outside the housing 34 may be LIDAR devices.

The air inlet tube 36 passes through the housing 34. The air inlet tube 36 may pass through the cavity 50, or the air inlet tube 36 may be separated from the cavity 50, i.e., pass through an area walled off from the cavity 50 (not shown). The air inlet tube 36 includes one or more inlet openings 52 to outside the housing 34. The forward-facing panel 48 may include the inlet openings 52, as best seen in FIG. 2. The air inlet tube 36 includes a first portion 54, a locally low portion 56, and a second portion 58. (The adjectives "first" and "second" are used throughout this document as identifiers and are not intended to signify importance or order.) The first portion 54 of the tube 36 extends from the locally low portion 56 upward and forward relative to the vehicle 32 toward the inlet opening 52. Thus, the first portion 54 extends downward and rearward to the locally low portion 56. The first portion 54 may extend directly from the inlet opening 52, or an intermediate portion may extend from the inlet opening 52 to the first portion 54. Multiple first portions 54 may extend toward multiple inlet openings 52, or a single first portion 54 extending to the locally low portion 56 may branch toward the inlet openings 52. The locally low portion 56 is defined as a portion of the air inlet tube 36 that is farther downward relative to the vehicle 32 than all portions adjacent to the locally low portion 56. The second portion 58 extends from the locally low portion 56 upward and rearward toward a filter 60 and/or a blower 62.

With reference to FIG. 4, the filter 60 removes solid particulates such as dust, pollen, mold, dust, and bacteria from air flowing through the filter 60. The filter 60 may be any suitable type of filter, e.g., paper, foam, cotton, stainless steel, oil bath, etc.

The blower 62 blows air received from the air inlet tube 36 toward the cavity 50. The blower 62 may be any suitable device for pushing air, e.g., a fan, a pump, a compressor, etc.

Forward motion of the vehicle 32 and/or the operation of the blower 62 generates airflow along a path through the air inlet tube 36, the filter 60, the blower 62, and the cavity 50. At least some of the interior sensors 40 are positioned in the path of air flowing through the air inlet tube 36. The path of air flows through the air inlet tube 36 from the first portion 54 to the locally low portion 56 to the second portion 58. The interior sensors 40 are downstream from the blower 62 and from the second portion 58 of the air inlet tube 36. The blower 62 may be downstream from the filter 60, the second portion 58 of the air inlet tube 36, and the drain 38. For the purposes of this disclosure, "downstream" means along the path of air in the direction of flow, and "upstream" means along the path of air opposite the direction of flow. The upward angle of the second portion 58 of the air inlet tube 36 can cause rain in the air to hit the second portion 58 and flow downward to the drain 38. Condensation may also occur as the path of airflow is directed upward by the second portion 58, and the condensed water can flow downward to the drain 38. The interior sensors 40 downstream of the second portion 58 may thus receive dehumidified air, i.e., air containing a lower quantity of liquid water and/or water vapor than the air outside the housing 34.

The air inlet tube 36 includes the drain 38 at the locally low portion 56. The drain 38 may be positioned at a lowest point of the air inlet tube 36. The drain 38 includes a drain tube 64, a drain valve 66, and a valve actuator 68. The drain tube 64 extends downward from the air inlet tube 36, specifically from the locally low portion 56. The drain valve 66 is movable between an open position and a closed position. In the open position, the drain valve 66 permits fluid to flow through the drain tube 64, and in the closed position, the drain valve 66 blocks fluid from flowing through the drain tube 64. The valve actuator 68 is actuatable to open and close the drain valve 66. The valve actuator 68 may be any suitable device for responding to a signal by generating mechanical motion for moving the drain valve 66 between the open and closed positions, e.g., a linear or rotational actuator; hydraulic, pneumatic, electric, mechanical, etc.

A water-level sensor 70 may be disposed in the drain 38. The water-level sensor 70 may be operable to detect a height of water in the drain tube 64 or to detect a presence of water at a particular height. For example, the water-level sensor 70 may be a float, displacer, bubbler, differential pressure transmitter, load cell, magnetic level gauge, capacitance transmitter, magnetostrictive level transmitter, ultrasonic level transducer, laser level transmitter, radar level transmitter, a water-presence sensor, etc. The water-level sensor 70 may be positioned in the drain tube 64 at a height defining a water-level threshold, described below with respect to a process 600.

Figure 5:
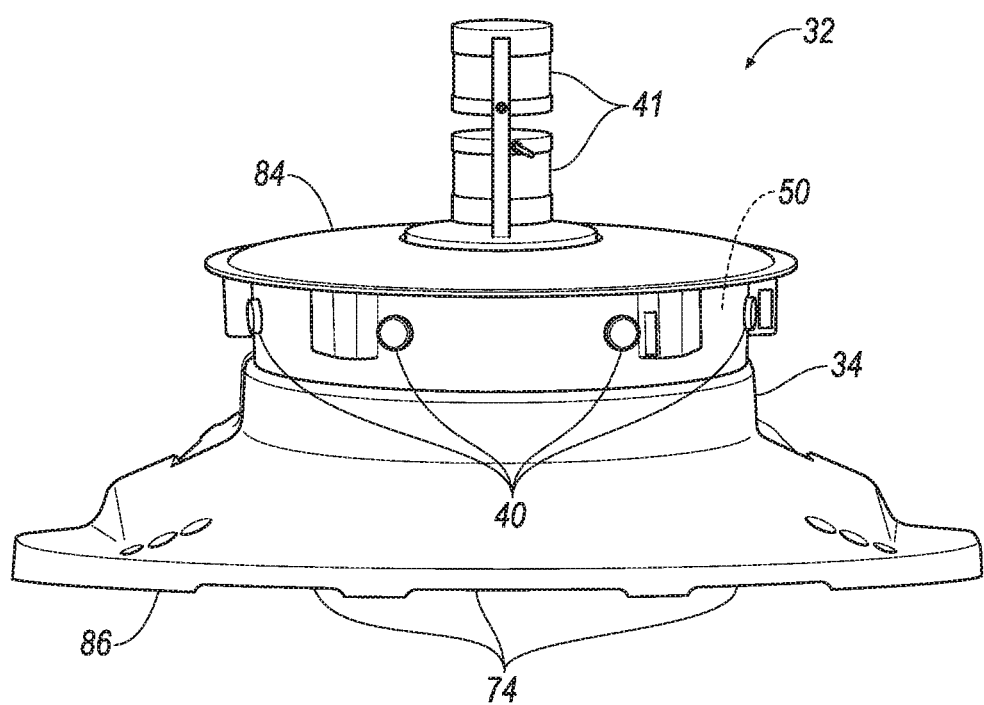
FIG. 5 is a rear view of the sensor assembly.

A water outlet tube 72 may extend from the drain 38 to one or more outlet openings 74 (shown in FIG. 5). The water outlet tube 72 permits water that has collected in the drain 38 to flow out when the drain valve 66 is in the open position.

A heater 76 may be thermally connected to the drain 38. For the purposes of this disclosure, "thermally connected" means attached such that heat may efficiently flow and both ends of the thermal connection (if separate) are substantially the same temperature within a short time. The heater 76 may use, e.g., resistive heating. The heater 76 may extend around the drain tube 64. For example, the heater 76 may be flexible and may be wrapped about the drain tube 64.

Figure 6:
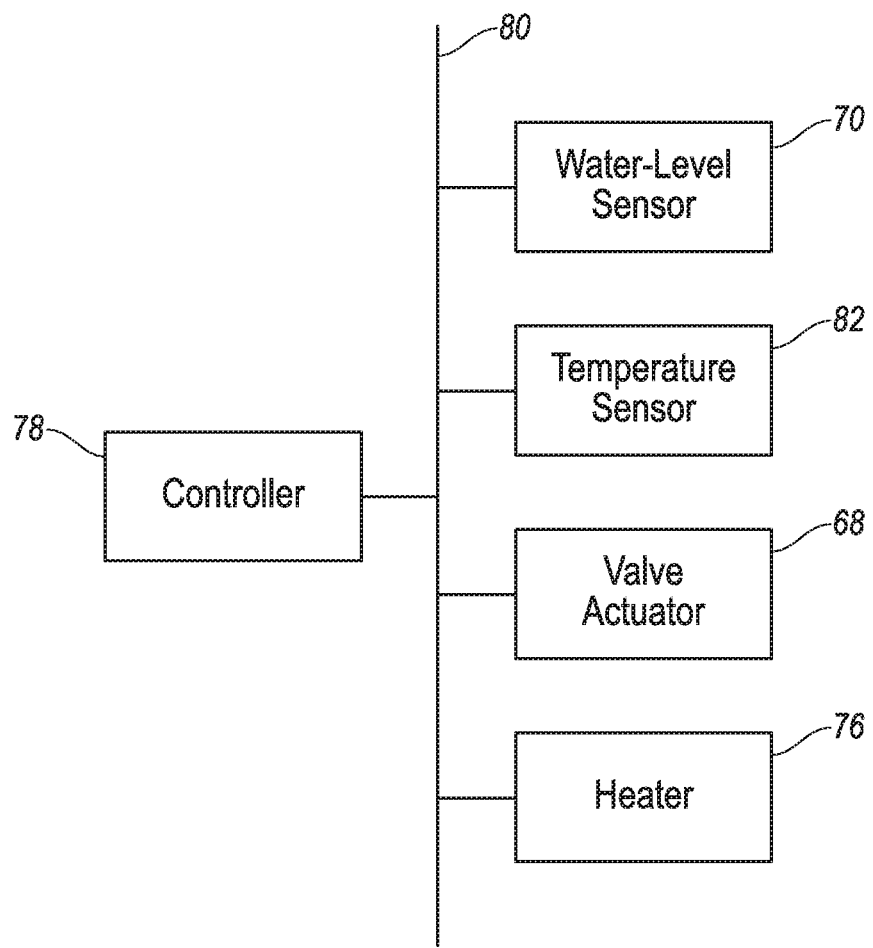
FIG. 6 is a block diagram of a control system for the sensor assembly.

With reference to FIG. 6, a controller 78 is a microprocessor-based controller. The controller 78 includes a processor, memory, etc. The memory of the controller 78 includes memory for storing instructions executable by the processor as well as for electronically storing data and/or databases. The controller 78 may be the same computer used for autonomous operation of the vehicle 32 or may be separate.

The controller 78 may transmit and receive data through a communications network 80 such as a controller area network (CAN) bus, Ethernet, WiFi, Local Interconnect Network (LIN), onboard diagnostics connector (OBD-II), and/or by any other wired or wireless communications network. The controller 78 may be communicatively coupled to the water-level sensor 70, a temperature sensor 82, the valve actuator 68, the heater 76, and other components via the communications network 80.

The temperature sensor 82 detects a temperature of an ambient environment. The temperature sensor 82 may be any device that generates an output correlated with temperature, e.g., a thermometer, a bimetallic strip, a thermistor, a thermocouple, a resistance thermometer, a silicon bandgap temperature sensor, etc.

Figure 7:
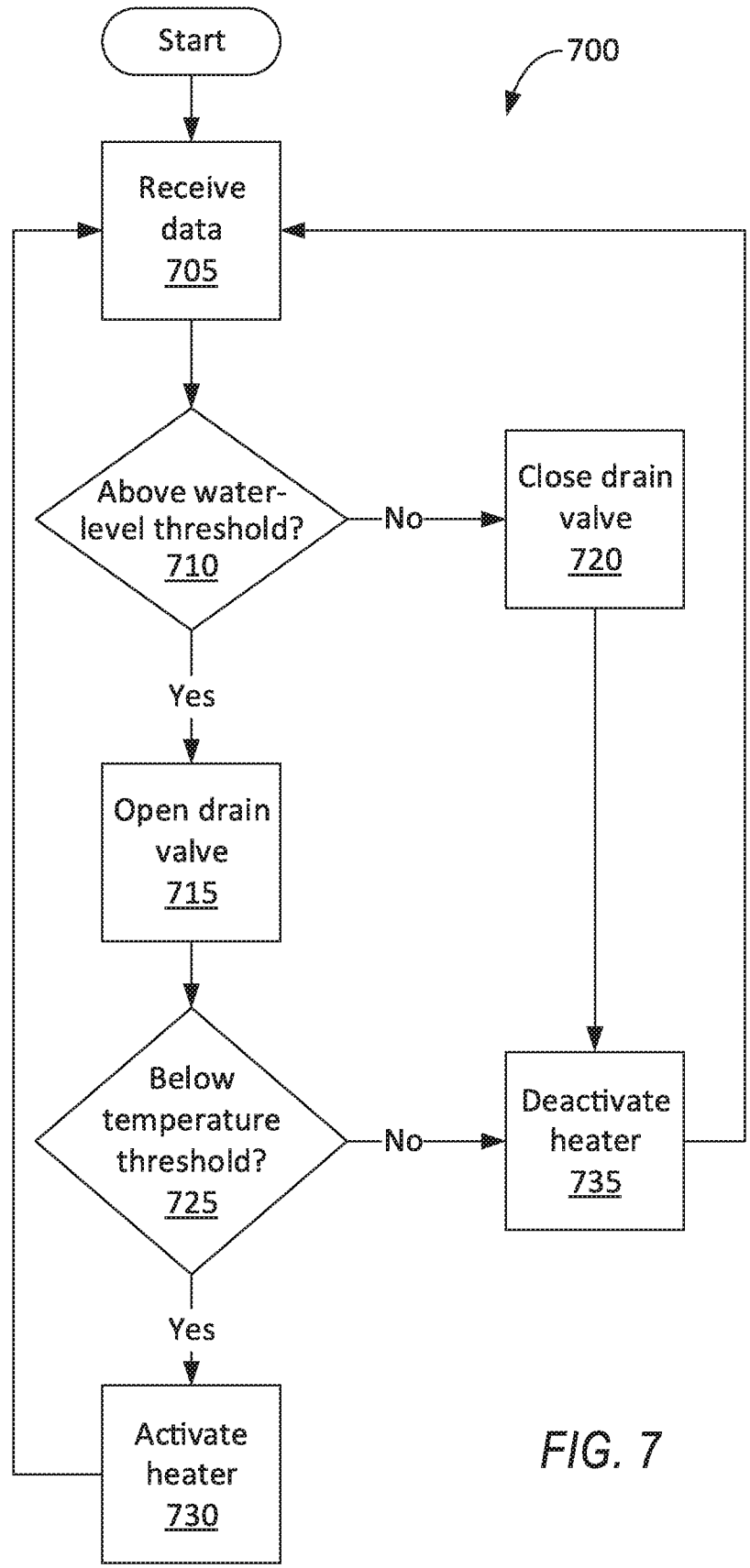
FIG. 7 is a process flow diagram of an example process for draining the sensor assembly.

FIG. 7 is a process flow diagram illustrating the exemplary process 700 for draining the sensor assembly 30. The memory of the controller 78 stores executable instructions for performing the steps of the process 700. In general, the process 700 is to open the drain valve 66 upon detecting a water level in the drain 38 above the water-level threshold, and to activate the heater 76 upon detecting the water level in the drain 38 above the water-level threshold and an ambient temperature below a temperature threshold. The water-level threshold and the temperature threshold are chosen to prevent water from overflowing from the drain 38 or freezing in the drain 38.

The process 700 begins in a block 705, in which the controller 78 receives water-level data from the water-level sensor 70 and temperature data from the temperature sensor 82. The water-level data may be a number representing a water level in the drain 38, or the water-level data may be a binary value representing whether water is detected at a particular height of the drain tube 64, i.e., a height at which the water-level sensor 70 is fixed (which may be chosen to equal the water-level threshold). The number representing the water level in the drain 38 may be a proportion of a height of the drain tube 64, e.g., 0.75 for three quarters full. The temperature data may be a number representing an ambient temperature, e.g., degrees Celsius (° C.).

Next, in a decision block 710, the controller 78 determines whether the water level in the drain 38 is above the water-level threshold. The water-level threshold may be chosen to minimize a risk of the drain 38 overflowing and to minimize a frequency of opening the drain valve 66. For example, the water-level threshold may be greater than half of a capacity of the drain 38, e.g., 80%. The capacity of the drain 38 is a maximum quantity of water that the drain 38 can contain without overflowing. The height of the drain tube 64 may be used as a proxy for the capacity, e.g., if the drain tube 64 has a constant vertical cross-section. If the water level in the drain 38 is below the water-level threshold, the process 700 proceeds to a block 720.

If the water level in the drain 38 is above the water-level threshold, next, in a block 715, the controller 78 actuates the valve actuator 68 to open the drain valve 66, i.e., to move the drain valve 66 to the open position, thus permitting water in the drain 38 to flow out through the water outlet tube 72. If the drain valve 66 is already in the open position, then the controller 78 maintains the drain valve 66 in the open position. After the block 715, the process 700 proceeds to a decision block 725

After the decision block 710, if the water level in the drain 38 is below the water-level threshold, in the block 720, the controller 78 actuates the valve actuator 68 to close the drain valve 66, i.e., to move the drain valve 66 to the closed position, which blocks water from flowing out through the drain 38. If the drain valve 66 is already in the closed position, then the controller 78 maintains the drain valve 66 in the closed position. After the block 720, the process 700 proceeds to a block 735.

After the block 715, in a decision block 725, the controller 78 determines whether the ambient temperature is below the temperature threshold. The temperature threshold may be chosen to prevent water from freezing in the drain 38 while minimizing how often the heater 76 runs; for example, the temperature threshold may be a temperature that is above the freezing point of water by a safety factor, e.g., 5° C. If the ambient temperature is above the temperature threshold, the process 700 proceeds to a block 735.

If the ambient temperature is below the temperature threshold, next, in a block 730, the controller 78 activates the heater 76. If the heater 76 is already active, i.e., generating heat, the controller 78 maintains the heater 76 as active. After the block 730, the process 700 returns to the block 705 to continue monitoring the water level and ambient temperature.

After the decision block 725, if the ambient temperature is above the temperature threshold, in the block 735, the controller 78 deactivates the heater 76. If the heater 76 is already off, i.e., not generating heat, the controller 78 maintains the heater 76 as off. After the block 735, the process 700 returns to the block 705 to continue monitoring the water level and ambient temperature In general, the computing systems and/or devices described may employ any of a number of computer operating systems, including, but by no means limited to, versions and/or varieties of the Ford Sync® application, AppLink/Smart Device Link middleware, the Microsoft Automotive® operating system, the Microsoft Windows® operating system, the Unix operating system (e.g., the Solaris® operating system distributed by Oracle Corporation of Redwood Shores, Calif.), the AIX UNIX operating system distributed by International Business Machines of Armonk, N.Y., the Linux operating system, the Mac OSX and iOS operating systems distributed by Apple Inc. of Cupertino, Calif., the BlackBerry OS distributed by Blackberry, Ltd. of Waterloo, Canada, and the Android operating system developed by Google, Inc. and the Open Handset Alliance, or the QNX® CAR Platform for Infotainment offered by QNX Software Systems. Examples of computing devices include, without limitation, an on-board vehicle computer, a computer workstation, a server, a desktop, notebook, laptop, or handheld computer, or some other computing system and/or device.

Computing devices generally include computer-executable instructions, where the instructions may be executable by one or more computing devices such as those listed above. Computer executable instructions may be compiled or interpreted from computer programs created using a variety of programming languages and/or technologies, including, without limitation, and either alone or in combination, Java™, C, C++, Matlab, Simulink, Stateflow, Visual Basic, Java Script, Perl, HTML, etc. Some of these applications may be compiled and executed on a virtual machine, such as the Java Virtual Machine, the Dalvik virtual machine, or the like. In general, a processor (e.g., a microprocessor) receives instructions, e.g., from a memory, a computer readable medium, etc., and executes these instructions, thereby performing one or more processes, including one or more of the processes described herein. Such instructions and other data may be stored and transmitted using a variety of computer readable media. A file in a computing device is generally a collection of data stored on a computer readable medium, such as a storage medium, a random access memory, etc.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a ECU. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

In the drawings, the same reference numbers indicate the same elements. Further, some or all of these elements could be changed. With regard to the media, processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their plain and ordinary meanings as understood by those skilled in the art unless an explicit indication to the contrary in made herein. In particular, use of the singular articles such as "a," "the," "said," etc. should be read to recite one or more of the indicated elements unless a claim recites an explicit limitation to the contrary.

The disclosure has been described in an illustrative manner, and it is to be understood that the terminology which has been used is intended to be in the nature of words of description rather than of limitation. Many modifications and variations of the present disclosure are possible in light of the above teachings, and the disclosure may be practiced otherwise than as specifically described.

What is claimed is:

1. A sensor assembly comprising:
   a housing including a cavity;
   an air inlet tube passing through the housing and including an inlet opening, a first portion, a locally low portion, a second portion, and a drain, wherein the air inlet tube defines a path of air that flows through the air inlet tube from the inlet opening to the first portion, then to the locally low portion, then to the second portion, and exits out of the air inlet tube into the cavity;
   a sensor in the cavity;
   a heater thermally connected to the drain; and
   a controller communicatively coupled to the heater and programmed to activate the heater upon detecting a water level in the drain above a water-level threshold;
   wherein the inlet opening is open to outside the housing;

the first portion extends downward to the locally low portion;

the locally low portion is farther downward than all portions of the air inlet tube adjacent to the locally low portion;

the locally low portion includes the drain; and the second portion extends upward from the locally low portion.

2. The sensor assembly of claim 1, wherein the drain includes a drain tube extending downward from the air inlet tube, and the heater extends around the drain tube.

3. The sensor assembly of claim 1, wherein the controller is programmed to activate the heater upon detecting an ambient temperature below a temperature threshold.

4. The sensor assembly of claim 1, wherein the water-level threshold is greater than half of a capacity of the drain.

5. The sensor assembly of claim 1, wherein the drain includes a drain valve.

6. The sensor assembly of claim 5, further comprising a valve actuator actuatable to open and close the drain valve.

7. The sensor assembly of claim 6, wherein the controller is communicatively coupled to the valve actuator and programmed to actuate the valve actuator to open the drain valve upon detecting a water level in the drain above a water-level threshold.

8. The sensor assembly of claim 7, further comprising a water-level sensor, wherein the drain includes a drain tube extending downward from the air inlet tube, and the water-level sensor is positioned in the drain tube at a height defining the water-level threshold.

9. The sensor assembly of claim 1, further comprising a water-level sensor disposed in the drain.

10. The sensor assembly of claim 1, wherein the housing includes a forward-facing panel, and the forward-facing panel includes the inlet opening.

11. The sensor assembly of claim 1, further comprising a blower in the path of air flowing through the air inlet tube, wherein the blower is downstream from the drain and upstream from the sensor.

12. The sensor assembly of claim 1, wherein the housing is shaped to be attachable to a roof of a vehicle.

13. The sensor assembly of claim 1, further comprising a plurality of sensors including the sensor, the sensors positioned in the cavity.

14. The sensor assembly of claim 13, wherein the sensors are cameras.

* * * * *